(12) United States Patent
Lozhkin (10) Patent No.: US 8,836,426 B2
(45) Date of Patent: Sep. 16, 2014

(54) ADAPTIVE LINEARIZER WITH NARROWBAND FEEDBACK PATH

(71) Applicant: Fujitsu Limited, Kawasaki (JP)

(72) Inventor: Alexander Nikolaevich Lozhkin, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 56 days.

(21) Appl. No.: 13/669,519

(22) Filed: Nov. 6, 2012

(65) Prior Publication Data

US 2013/0120062 A1    May 16, 2013

(30) Foreign Application Priority Data

Nov. 16, 2011   (JP) ................... 2011-251130

(51) Int. Cl.
*H03F 1/26* (2006.01)
*H03F 3/24* (2006.01)
*H03F 1/32* (2006.01)

(52) U.S. Cl.
CPC ............... *H03F 1/3247* (2013.01); *H03F 3/24* (2013.01); *H03F 2200/453* (2013.01); *H03F 2201/3224* (2013.01); *H03F 1/3258* (2013.01)
USPC ......................................... 330/149

(58) Field of Classification Search
CPC ............................. H03F 1/3241; H03F 1/3247
USPC .................... 330/136, 149; 455/114.3
See application file for complete search history.

(56) References Cited

U.S. PATENT DOCUMENTS

| | | | |
|---|---|---|---|
| 5,049,832 A | 9/1991 | Cavers | |
| 5,175,747 A | 12/1992 | Murakami | |
| 6,931,080 B2 | 8/2005 | Giardina et al. | |
| 6,973,139 B2 | 12/2005 | Ahn et al. | |
| 7,151,405 B2 * | 12/2006 | Nezami | ........................ 330/149 |
| 7,170,345 B2 | 1/2007 | Hongo | |
| 7,203,247 B2 | 4/2007 | Bauder et al. | |
| 7,333,561 B2 | 2/2008 | Pinckley et al. | |

FOREIGN PATENT DOCUMENTS

| | | |
|---|---|---|
| JP | 2003-124752 A | 4/2003 |
| JP | 2005-333353 A | 12/2005 |
| JP | 2010-50908 A | 3/2010 |

OTHER PUBLICATIONS

Hsin-Hung Chen, et al.; "Joint Polynomial and Look-Up-Table Predistortion Power Amplifier Linearization," IEEE Transactions on Circuits and Systems—II: Express Briefs, vol. 53, No. 8, pp. 612-616 (Aug. 2006).
Y. Akaiwa; "Introduction to Digital Mobile Communication," Wiley, New York (1997), resubmitted pp. 18 and 19 and this includes the first two pages and back cover.
Lei Ding et al.; "A Robust Digital Baseband Predistorter Constructed Using Memory Polynomials," IEEE Transaction on Communications, vol. 52, No. 1, pp. 159-165 (Jan. 2004).
R. Marsalek, et al.; "From Post-Distortion to Pre-Distortion for Power Amplifier Linearization, "IEEE Communications Letters, vol. 7, No. 7, pp. 308-310 (Jul. 2003).

* cited by examiner

*Primary Examiner* — Steven J Mottola
(74) *Attorney, Agent, or Firm* — Fujitsu Patent Center (57) ABSTRACT

An ISI Replica unit is provided, which produces interference components similar to one due to LPF into the output of HPA MODEL unit. An HPA MODEL unit models the characteristic of HPA using the output signal of the predistorter and an error signal obtained by subtracting a feedback signal from the output of the ISI Replica so that the error signal approaches zero. The feedback signal is used after filtration by LPF, thereby including interference components. The error signal obtained by the feedback signal after LPF and the output signal of ISI Replica unit includes few interference components, thereby modeling by the HPA MODEL unit becomes accurate and the linearization performances become better.

7 Claims, 9 Drawing Sheets

ADAPTIVE LINEARIZER WITH NARROWBAND FEEDBACK PATH

CROSS-REFERENCE TO RELATED APPLICATION

This application is based upon and claims the benefit of priority of the prior Japanese Patent Application No. 2011-251130, filed on Nov. 16, 2011, the entire contents of which are incorporated herein by reference.

FIELD

Embodiments described below relate to an adaptive linearizer with a narrowband feedback path.

BACKGROUND

Recently, the linearizer for a high-power amplifier has been required to operate with precision because of the development of a high bit rate communication system. Problems arise when RF (radio frequency) signals are passing through the nonlinear high-power amplifier (HPA). Often, to increase the efficiency of high-power amplifiers (HPAs), they are driven into a nonlinear region.

The effect of nonlinear HPAs in digital communication systems has been investigated in various papers [non-patent documents 1-4]. The results show that the HPA nonlinearity generates in-band and out-of-band signal distortions.

Digital predistortion (PD) is one of the most promising techniques to reduce out-of-band and in-band distortions by linearizing distortion on a signal which passes through nonlinear HPAs. The basis of the predistortion approach for a compensating nonlinear distortion HPA is to design the inverse system of the compensated nonlinear system (HPA).

Figure 1:
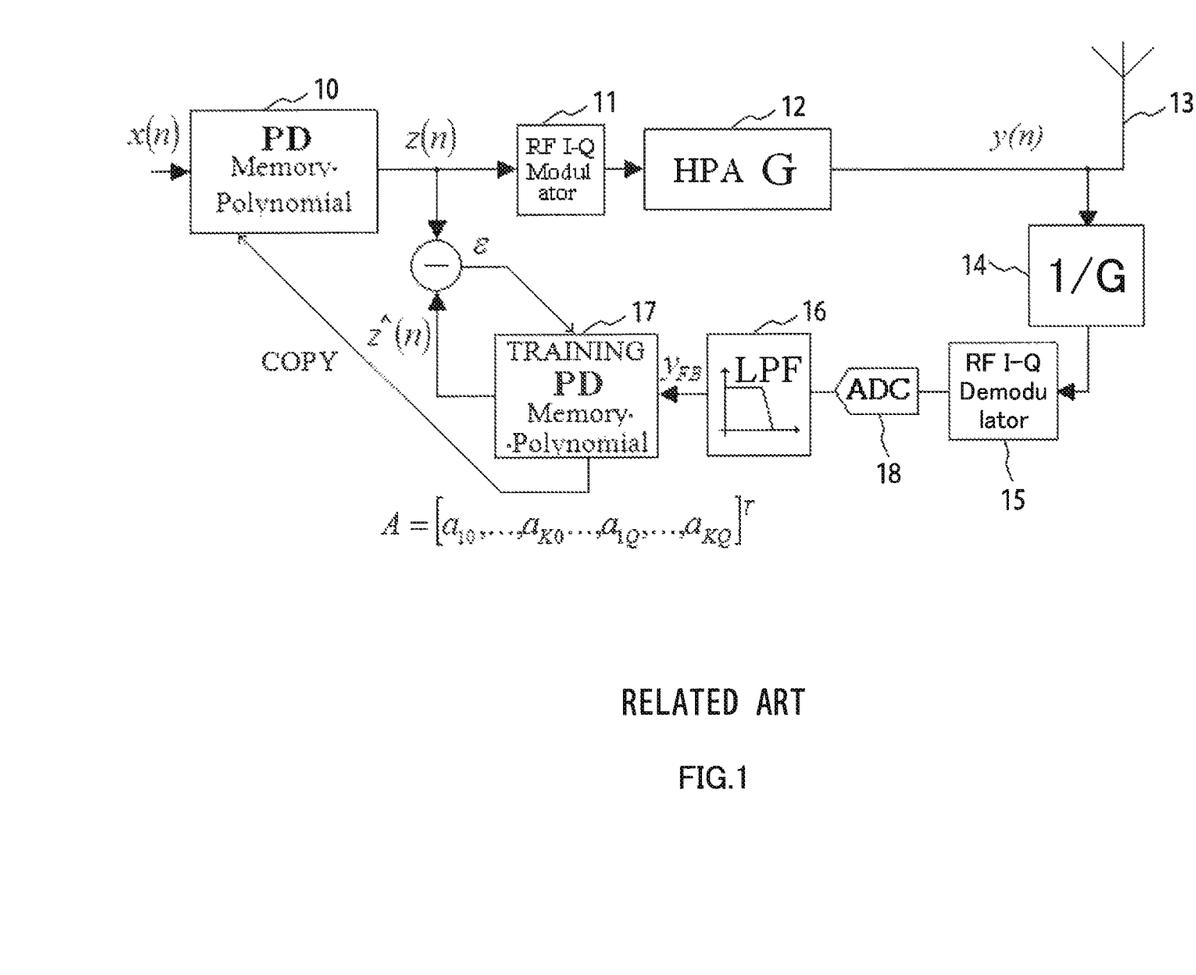
FIG. 1 illustrates a simplified block diagram of a transmitter with the adaptive digital predistorter (PD) with indirect learning architecture according to prior art.

FIG. 1 illustrates the simplified block diagram of a transmitter with the adaptive digital predistorter (PD) with indirect learning architecture according to a prior art.

A signal x(n) is a digital baseband signal sent from a signal transmitter (not illustrated). The signal x(n) is input to the predistorter 10. The predistorter 10 distorts the input signal x(n) according to a memory polynomial which represents an inverse characteristic of HPA 12. The predistorter 10 may be a calculator with hardware logics, a digital signal processor (DSP), or a processor which operates with an installed program. The output signal z(n) of the predistorter 10 is input to an RF I-Q modulator 11. The RF I-Q modulator 11 modulates the baseband signal x(n) from the predistorter 10 into a radio frequency signal.

The output signal from RF I-Q modulator 11 is input to HPA 12. HPA 12 amplifies the output signal from the RF I-Q modulator 11 with a gain G. The output signal y(n) from HPA 12 is sent out from an antenna 13. Additionally, the signal y(n) is input to an attenuator 14 with a gain 1/G through a feedback path, where a gain G applied to a signal by HPA 12 is cancelled. The output signal from the attenuator 14 is input to RF I-Q demodulator 15 where modulation applied to a signal by RF I-Q modulator 11 is cancelled. The output signal from RF I-Q demodulator 15 is digitized by an analog-to-digital converter (ADC) 18. The output signal from ADC 18 is passed through a low pass filter 16, outputting a signal $y_{FB}$.

The signal $y_{FB}$ is input to a training predistorter 17. The training predistorter 17 receives an error signal $\epsilon$ which is obtained by subtracting the signal $\hat{z}(n)$ from the signal z(n). The training predistorter 17 calculates coefficients $A=[a_{10}, \ldots, a_{K0}, \ldots, a_{1Q}, \ldots, a_{KQ}]^T$ of the memory polynomial so that the error signal $\epsilon$ is minimized as described later. The memory polynomial with the calculated coefficients, which models an inverse characteristic of HPA 12, is copied to the predistorter 10.

The HPA nonlinearity causes the appearance of parasitic frequency components in the output signal y(n), occupying P times the bandwidth of the input signal x(n). It is normal practice to assume P to be equal to 5 [non-patent document 3]. As a general rule of thumb, the 5th order of HPA nonlinearity causes the appearance of parasitic components occupying 5 times the bandwidth of the input signal. In adaptive PD (PreDistorter) systems, it is necessary to have a feedback path. Input signal x(n) (FIG. 1) from the DAC (digital-to-analog converter, not illustrated) output can have the sampling clock as high as 1 GHz for signals with bandwidth of 100 MHz. Accounting for intermodulation products (known as IMD in the relevant art field) in an HPA output, the feedback bandwidth for a sample-by-sample comparison of the signals z(n) and $\hat{z}(n)$ can reach 5*100=500 MHz.

In such cases, system costs are largely driven by high-performance (hi-speed and hi-bit-resolution) analog-to-digital converters (ADCs). An example of ADC is PXI-5922 sold by National Instruments, which may be used as a high-speed ADC. A catalog of digitizers is available from a web site (www.ni.com). For example, digitizing of the baseband signal with a bandwidth of 500 MHz requires an ADC sampling rate equal to at least 1 GHz according to the Nyquist sampling theorem [non-patent document 2].

However a higher sampling rate of 2 GHz is preferable for practical implementations. A less costly alternative adapts a DPD (Digital PreDistorter) using only narrowband feedback.

For baseband predistortion systems, the transmission path includes the PD. In adaptive PD systems illustrated in FIG. 1, it is necessary to add a feedback path from HPA 12, an attenuator 14 with gain 1/G, and a baseband PD adaptation system (Training PD block 17). The actual PD 10 placed in the transmission path is an exact copy of the training PD 17 in the feedback path.

In most practical implementations, the feedback path bandwidth is not infinite; it has a finite value. As illustrated in FIG. 1, the PD's feedback path bandwidth is limited by the pass-band of the anti-aliasing LPF 16. The aliasing on the signal occurs due to ADC 18. The analog signal has a broad bandwidth and when the analog signal is digitized by ADC 18, because a sampling clock frequency of ADC 18 is limited, the digitalizing process inevitably induces out-of-band frequency components, which are aliasing. Generally speaking, the ability of a PD to linearize deteriorates with a narrow feedback path bandwidth, as a narrowband feedback path bandwidth introduces additional distortions into the signal coming from the HPA output.

Figure 2:
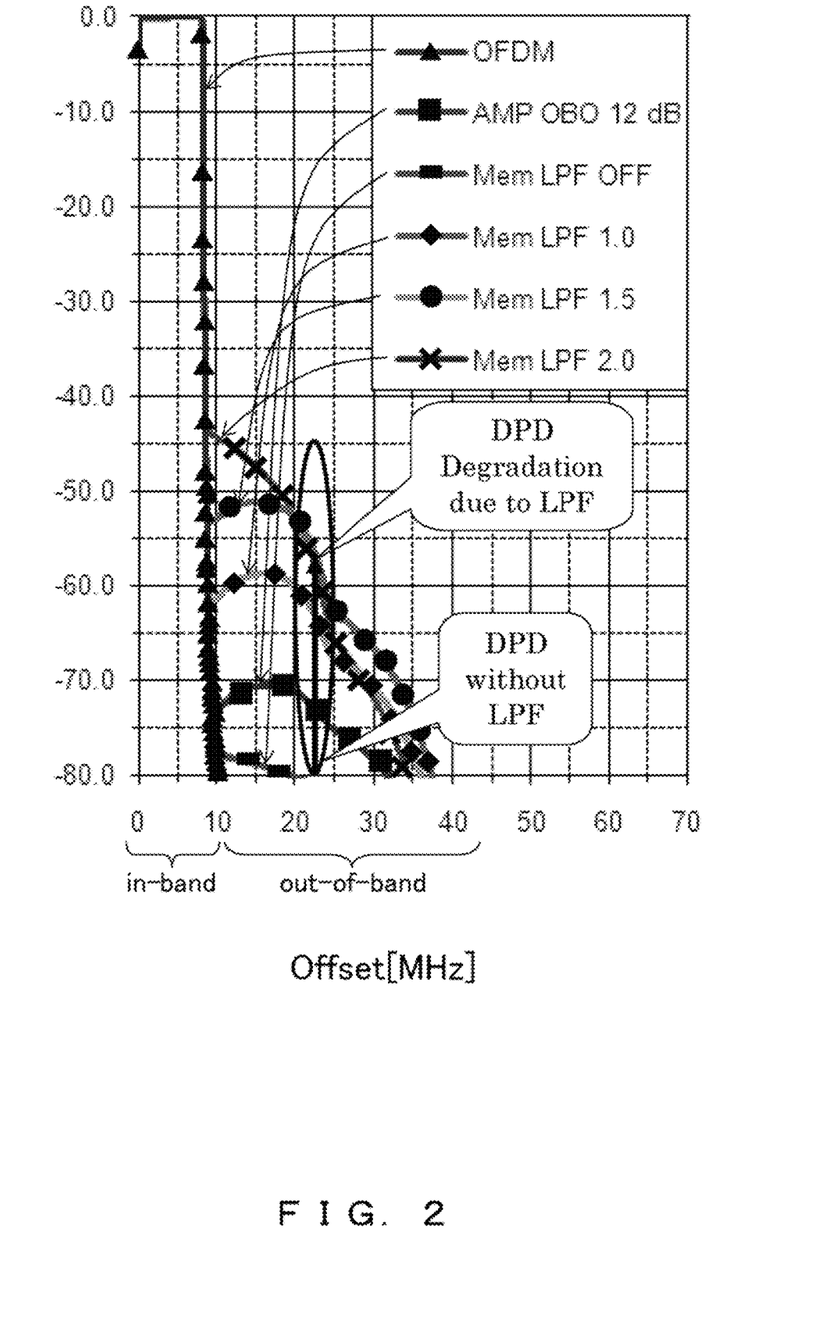
FIG. 2 illustrates a spectrum in the HPA equipped with the PD in the case in which the anti-aliasing LPF is placed into the PD feedback path and with the normalized LPF pass band as a parameter.
Figure 3:
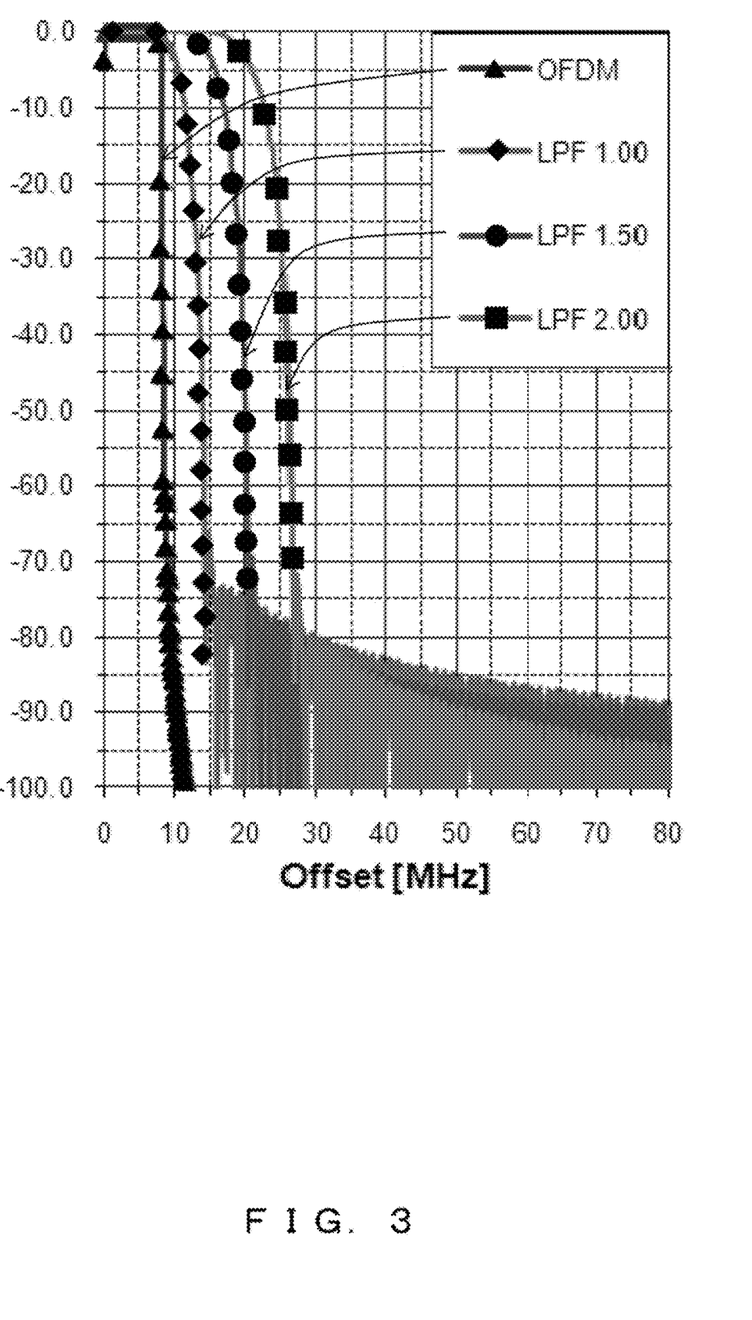
FIG. 3 illustrates the LPF transfer functions corresponding to FIG. 2.

FIG. 2 illustrates a spectrum in the HPA equipped with the PD in the case in which the anti-aliasing LPF is placed into the PD feedback path and with the normalized LPF pass band as a parameter. FIG. 3 illustrates the LPF transfer functions corresponding to FIG. 2.

The indexes with LPF define the normalized LPF pass band bandwidth—the LPF pass band bandwidth Δf normalized to the PD's input signal x(n) bandwidth ΔF. The baseband input x(n) is an OFDM signal with 2048 subcarriers and RF bandwidth is ΔF=20 MHz.

In FIGS. 2 and 3, a horizontal axis represents a frequency offset from a center of the signal band in frequency and a vertical axis represents an intensity of frequency components with an intensity of an in-band signal as 0 in dB. "OBO" is an abbreviation for Output Back-Off, which means the ratio of the signal power measured at the output of a high-power amplifier to the maximum output signal power. The numbers after LPF are normalized bandwidths. "Mem" means "memory" and Mem LPF means LPF with memory.

As can be seen from FIGS. 2 and 3, inserting the LPF into the PD's feedback path significantly deteriorates the linearization performances and causes the HPA output signal spectrum regrowth in an out-of-band frequency. That is, the lesser the out-of-band frequency components, the better the linearization performances of PD.

The operation of the memory polynomial predistorter is described below.

Firstly we briefly review memory polynomial linearization, following the treatment in [non-patent document 3].

FIG. 1 illustrates the indirect learning architecture that is used for PD identification. Here, PD identification means making the memory polynomial of the training predistorter 17 identical to the memory polynomial of the predistorter 10. The objective of the linearizer is to find a transformation of the signal $(z(n)=HPA^{-1}(x(n)))$ that in tandem combination with nonlinear HPA suffered with a memory effect will result in an identity system that produces the signal of interest without distortions at the output of HPA, i.e., demodulated $(y(n))=x(n)$. In this approach, two identical memory-polynomial systems (denoted in FIG. 1 as PD 10 and the training PD 17) are used for training predistortion.

The feedback path comprises from the LPF 16 that limits the feedback path bandwidth and a training PD 17 that has $y_{FB}(n)$ as its input and $\hat{z}(n)$ as its output. The actual predistorter 10 is an exact copy of the training predistorter 17; it has $x(n)$ as its input and $z(n)$ as its output.

The LPF 16 is a linear system with a memory, and therefore it introduces the interference (ISI; Interference Signal Indicator) between feedback samples $y_{FB}(n)$ and the HPA output. Thus the signal samples in the feedback path at the LPF output become correlated with themselves. For further PD performance degradation analysis, it is possible to replace the LPF 16 in PD illustrated in FIG. 1 with some equivalent external interference source as illustrated in FIG. 4.

Figure 4:
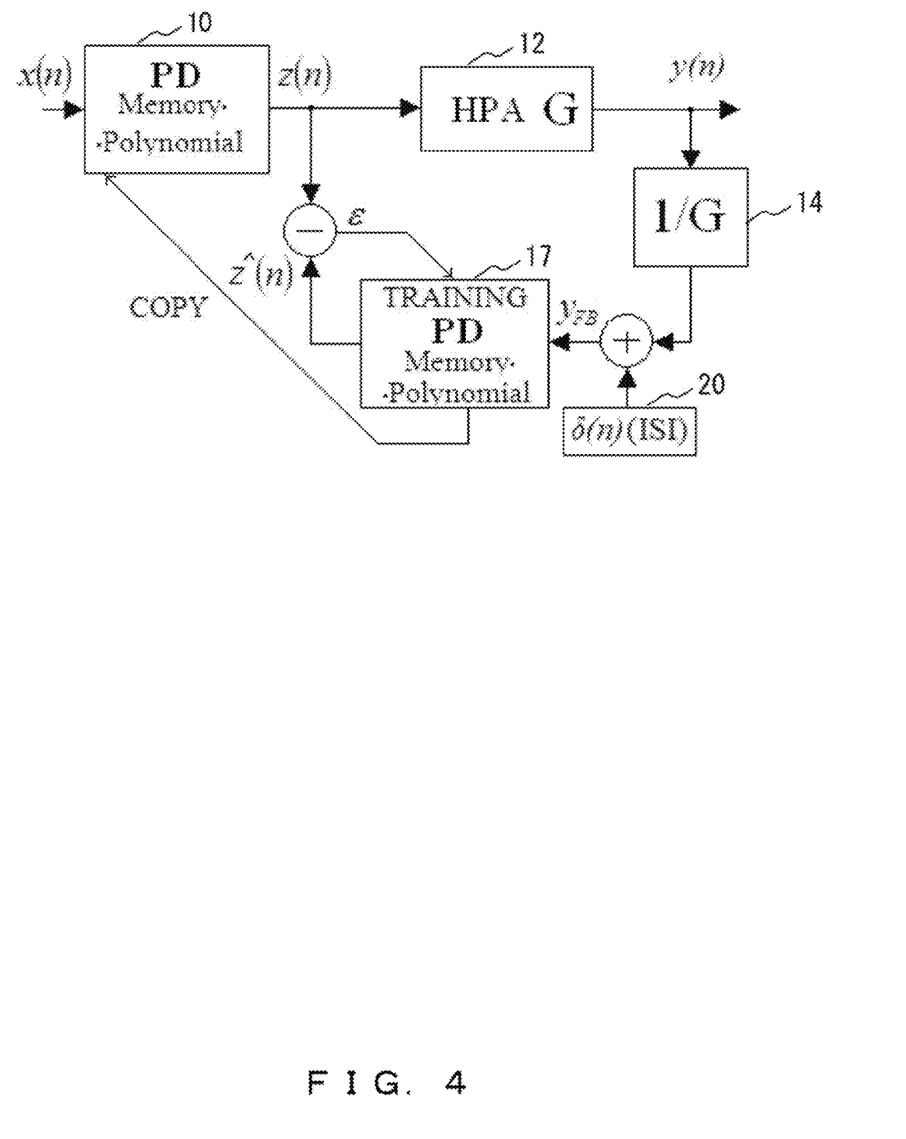
FIG. 4 illustrates the linearizer with an LPS equivalent interference source.

FIG. 4 illustrates the linearizer with an LPF equivalent interference source.

In FIG. 4, like components to those of FIG. 1 are denoted with like numerals.

In FIG. 4, ADC 18, RF I-Q modulator 11, and RF I-Q demodulator 15 in FIG. 1 are omitted for brevity of explanation and the source 20 of the interference $\delta(n)$ which is added to the output of the attenuator 14 is introduced as an equivalent structure of LPF 16 in that LPF 16 introduces the interference.

For the moment, let's assume that the bandwidth of the LPF placed in the PD feedback path is wide enough—i.e., that such an LPF does not introduce any significant distortions into the PD's feedback signal $y(n)$ from an HPA output. The exact influence of the LPF placed in the feedback path on the PD linearization performances will be discussed later. Thus, the following approximation becomes valid: $y_{FB}(n)=y(n)$ and ISI term $\delta(n)=0$. The memory polynomial predistorter can be described in a similar manner to [non-patent document 3] as:

$$z(n) = \sum_{k=1}^{K} \sum_{q=0}^{Q} q_{kq} \cdot x(n-q) \cdot |x(n-q)|^{k-1} \quad (1)$$

where $a_{kq}$ are the unknown complex memory-polynomial predistorter coefficients; $x(n)$ is transmitting signal samples at the discrete time n. The memory polynomial predistorter calculates the output signal $z(n)$ using expression (1) which is preinstalled in the memory polynomial predistorter, of which $a_{kq}$ is variable; k is an index indicating an order of the memory-polynomial; K is the order of the memory-polynomial; q is an index indicating a memory effect of the memory-polynomial; and Q indicates a maximum sample included in the memory-polynomial as the memory effect.

Ideally, after initialization through indirect learning, at convergence, we should have $z(n)=\hat{z}(n)$, or in the matrix form [see non-patent document 1]

$$Z = Y \cdot A \quad (2)$$

where, $y_{kq}(n)=y(n-q) \cdot |y(n-q)|^k$; $Z=[z(0),z(1), \ldots, z(N-1)]^T$, $Y=[Y_{10}, \ldots, Y_{k0}, \ldots, Y_{KQ}]$, $Y_{kq}=[y_{kq}(0) \ldots, y_{kq}(N-1)]^T$, $A=[a_{10}, \ldots, a_{K0} \ldots, a_{1Q}, \ldots, a_{KQ}]^T$, and N is the number of available data samples n.

where Z, Y and A are matrix form of $z(n)$, $y(n)$ and $a_{kq}$, respectively. And Here, it is assumed that $y(n)$ equals $z(n)$ at convergence.

The error term does not exist explicitly in the expression (2) for the indirect learning. Therefore, for further discussion, in order to investigate the influence of the linearization error, we employ the linear regression approach.

Indirect learning and polynomial regression are explained below.

The polynomial regression fits a nonlinear relationship between the value of $y_{FB}(n)$ and the corresponding conditional mean of $\hat{z}(n)$ (see FIG. 1). Since $\hat{z}(n)$ is linear with respect to unknown parameter $a_{kq}$, i.e., the $a_{kq}$ in expression (1), these unknowns can be estimated by a simple least-square method, by treating $y_{FB}, y_{FB}^2, \ldots y_{FB}^{K-1}$ as being distinct independent variables in a multiple regression model. Because usually only the approximate solution for polynomial regression can be obtained, there is an unobserved random $\epsilon(n)$ error (a.k.a. disturbance term) with a mean zero in expression (3) below. Thus, $$\epsilon(n)=z(n)-\hat{z}(n) \quad (3)$$

The regression results were less than satisfactory when the independent variables were correlated and the disturbance term is not i.i.d. (Independent and Identically Distributed). For the relatively wideband LPF, we can assume that the $\epsilon(n)$ error is an i.i.d. random variable. Given $y(n)$ and $z(n)$, a PD training task is to find parameters $a_{kq}$ of memory-polynomial PD as expressed in expression (2), which yields the predistorter. The algorithm converges when the error energy $\|\epsilon(n)\|$ is minimized. Thus, in the polynomial regression model we have:

$$z(n) = z^{\wedge}(n) + \varepsilon(n) = \sum_{k=1}^{K} \sum_{q=0}^{Q} a_{kq} \cdot y_{FB}(n-q) \cdot |y_{FB}(n-q)|^{k-1} + \varepsilon(n) \quad (4)$$

Our goal is to minimize $$\Sigma \epsilon^2(n)$$

over all $n=0, \ldots, N-1$ available data samples. With the assumption that the LPF pass band bandwidth can be rewritten as a linear regression function in terms of the unknown regression coefficients $a_{kq}$, the transfer function between input and output of the feedback path including LPF and the training PD is expressed as:

$$z(n) = \sum_{k=1}^{K} \sum_{q=0}^{Q} a_{kq} \cdot y_{kq}(n) + \varepsilon(n) \quad (5)$$

Equation (5) can be expressed in matrix form in terms of a design matrix Y, a response vector Z, a parameter vector A, and a "disturbance term" vector $\epsilon$ of random i.i.d. errors that add noise to the linear relationship between the dependent variable and regressors, which when using pure matrix notation, is written as $$Z = Y \cdot A + \epsilon \quad (6)$$

Where design matrix Y and parameter matrix A have been defined in expression (3) and $$\epsilon = [\epsilon(0), \epsilon(1), \ldots, \epsilon(N-1)]^T$$

is the disturbance vector. A similar expression, however, with an implicit disturbance term, has also been reported in [non-patent document 1]. The vector of an estimated polynomial regression coefficient $a_{kq}$ using a least-squares solution for expression (6) is:

$$A = (Y^T \cdot Y)^{-1} \cdot Y^T \cdot Z \quad (7)$$

For the linear regression analysis described above, ISI $\delta(n)$ increases the disturbance term in expressions (4) and (6) from $\epsilon(n)$ to $\epsilon(n) + \delta(n)$. Therefore, the total noise power for the disturbance term due to LPF inclusion into the PD's feedback path can be calculated as a sum of the partial noise powers for $\delta^{\wedge}(n)$ and $\delta(n)$:

$$\sigma_\Sigma^2 = \sigma_\epsilon^2 + \sigma_\delta^2 \quad (8)$$

where $\sigma$ means standard deviation of respective noise components; $\Sigma$ means total noise; $\epsilon$ means $\epsilon(n)$'s noise components; and $\delta$ means $\delta(n)$'s noise components.

An increase in the disturbance term in expressions (4) and (6) results in the increase in the spectral regrowth as it is illustrated in FIG. 2. If the spectral regrowth is increased, the training PD's performance to learn the characteristic of HPA degrades, thereby degrading the linearization performance of the linearizer.

Some of the prior arts describe a predistorter using an amplifier replica, a system in which a distortion is applied to an input signal in advance, and a predistorter using a distortion compensation polynomial.

PRIOR ART DOCUMENTS

Patent Documents

[patent document 1] Japanese Laid-Open Patent Publication No. 2005-333353
[patent document 2] Japanese Laid-Open Patent Publication No. 2003-124752
[patent document 3] Japanese Laid-Open Patent Publication No. 2010-50908

Non-Patent Document

[non-patent document 1] Hsin-Hung Chen, Chih-Hung Lin, Po-Chiun Huang, and Jiunn-Tsair Chen, "Joint Polynomial and Look-Up-Table Predistortion Power Amplifier Linearization," IEEE Transactions On Circuits And Systems—II: EXPRESS BRIEFS, VOL. 53, NO. 8, AUGUST 2006
[non-patent document 2] Y. Akaiwa "Introduction to Digital Mobile Communication," Wiley, New York (1997)

[non-patent document 3] Lei Ding et al., "A Robust Digital Baseband Predistorter Constructed Using Memory Polynomials," IEEE Transaction On Communications, Vol. 52, No 1, January 2004.
[non-patent document 4] R. Marsalek, P. Jardin, and G. Baudoin, "From Post-Distortion to Pre-Distortion for Power Amplifier Linearization, "IEEE Communications Letters, VOL. 7, NO. 7, JULY 2003.

SUMMARY

According to one aspect of the embodiment, an adaptive linearizer includes: a feedback path, a pass bandwidth of which is limited compared to an output signal bandwidth of an amplifier; a replica unit that introduces interference components into an output signal modeling the characteristic of the amplifier, which have a similar characteristic of interference components induced by a limited pass bandwidth of the feedback path; a training unit that calculates an inverse characteristic of a characteristic of the amplifier using an error signal between an output signal of the replica unit and an output signal of the amplifier which is fed back by the feedback path; and a predistorter that distorts a signal to be input to the amplifier according to the inverse characteristic calculated by the training unit.

The embodiments described below can provide the linearizer to reduce signal spectrum regrowth due to bandwidth limitation in the feedback path.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed

DESCRIPTION OF EMBODIMENTS

The embodiments described below reduce requirements for predistorter (PD) feedback bandwidth and enable a lowcomplexity, adaptive predistortion system to be designed with a narrowband feedback path to compensate for the non-linearity of an HPA.

Therefore the requirements for an analog-to-digital converter (ADC) placed in the feedback path can be relaxed. Thus, a low-speed and high bit resolution commercial grade ADC can be implemented in the PD instead of the costly high-speed mid bit resolution ADC. The level of the out-of-band spectrum at the HPA output with the embodiment is reduced subsequently.

Currently, high bit resolution of ADC roughly refers to over 19÷16 bit, low bit resolution refers to about 6÷8 bit and mid bit resolution refers to about 10÷12 bit.

The embodiment reduces the level of the ISI term $\delta(n)$ in the error signal $\epsilon(n)$. Therefore, a less noisy (more precise) HPA model can be obtained. Therefore, during the HPA model inverse function calculation, the quality of the linearization is improving.

Figure 5:
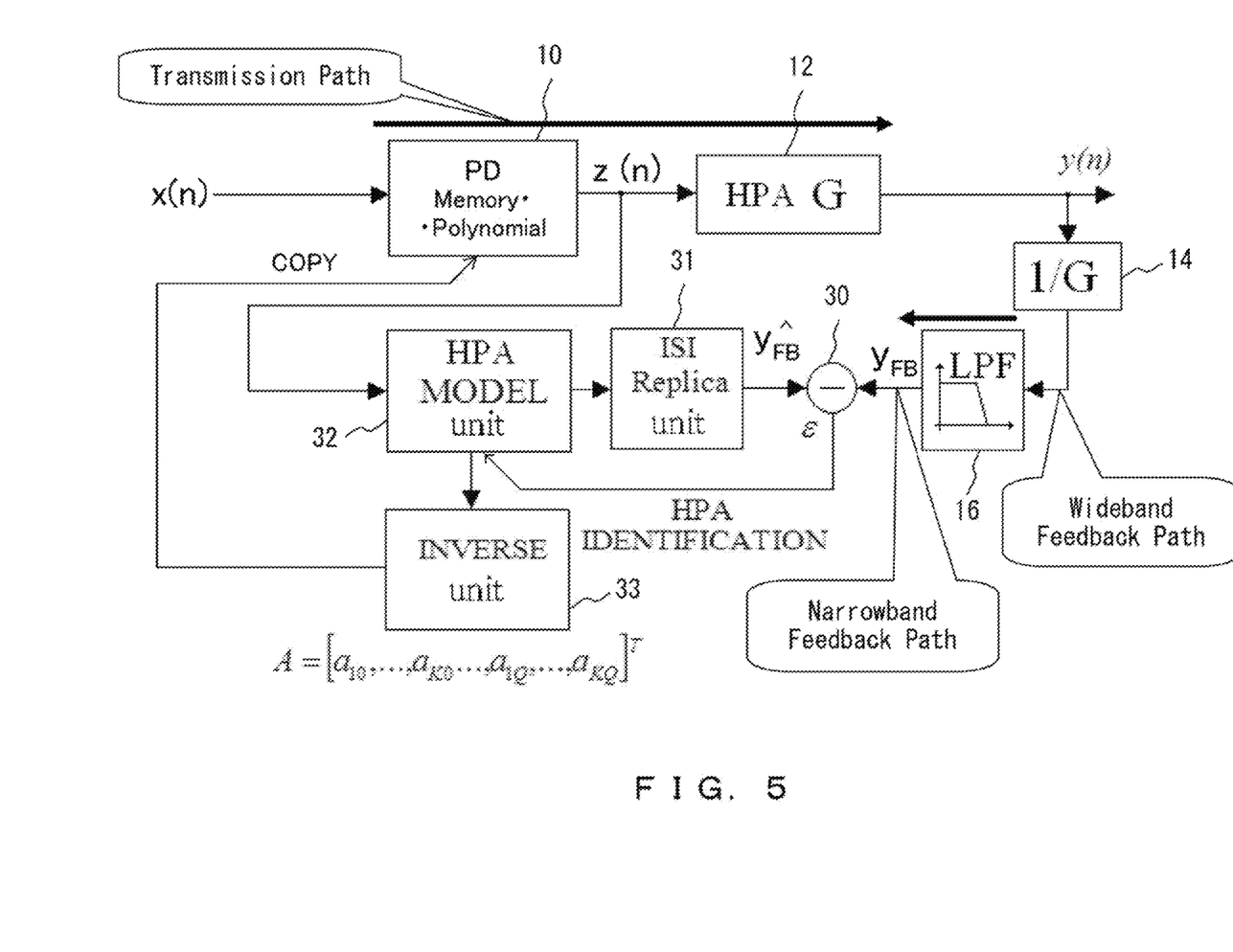
FIG. 5 illustrates the block-diagram of the linearizer according to the embodiment.

FIG. 5 illustrates the block-diagram of the linearizer according to the embodiment.

In FIG. 5, like components to those of FIG. 4 are denoted with like numerals. In FIG. 5, ADC, RF I-Q modulator and RF I-Q demodulator are omitted for brevity of explanation.

Although training PD 17 in FIG. 1 is replaced by HPA MODEL unit 32 and INVERSE unit 33, the function for predistortion is the same.

ISI Replica unit 31 adds the ISI term $\hat{\delta}(n)$, which is similar to $\delta(n)$, into the output signal of HPA MODEL unit 32. Thus, at the output of the subtractor 30, i.e., during the error signal $\epsilon$ calculations, ISI terms $\hat{\delta}(n)$ and $\delta(n)$, from the HPA model unit 32 and LPF 16, are compensated by each other.

ISI Replica unit 31 produces a replica of the interference components due to LPF 16, and at the output of the subtractor 30, the interference components due to LPF 16 are cancelled by the replica produced by ISI Replica unit 31. Therefore, HPA MODEL unit 32 can calculate a model of the characteristic of HPA 12 from signals z(n) and $\epsilon$ with a reduced influence of ISI, enabling an accurate modeling and better linearization performances. A calculated characteristic of HPA by HPA MODEL unit 32 is transmitted to INVERSE unit 33. INVERSE unit 33 calculates coefficients of a memory polynomial from the characteristic of HPA calculated by HPA MODEL unit 32. The characteristic function expressed by the coefficients of the memory polynomial is an inverse function of the characteristic of HPA modeled by HPA MODEL unit 32.

The simplest way to generate a replica ISI $\hat{\delta}(n)$ and add this ISI into the output signal of HPA MODEL unit 32 is to implement an LPF that is similar to the LPF that is placed into the PD's feedback path. In the embodiment, an additional filter is introduced in the reference signal path from an HPA MODEL unit 32 as illustrated in FIG. 6.

Figure 6:
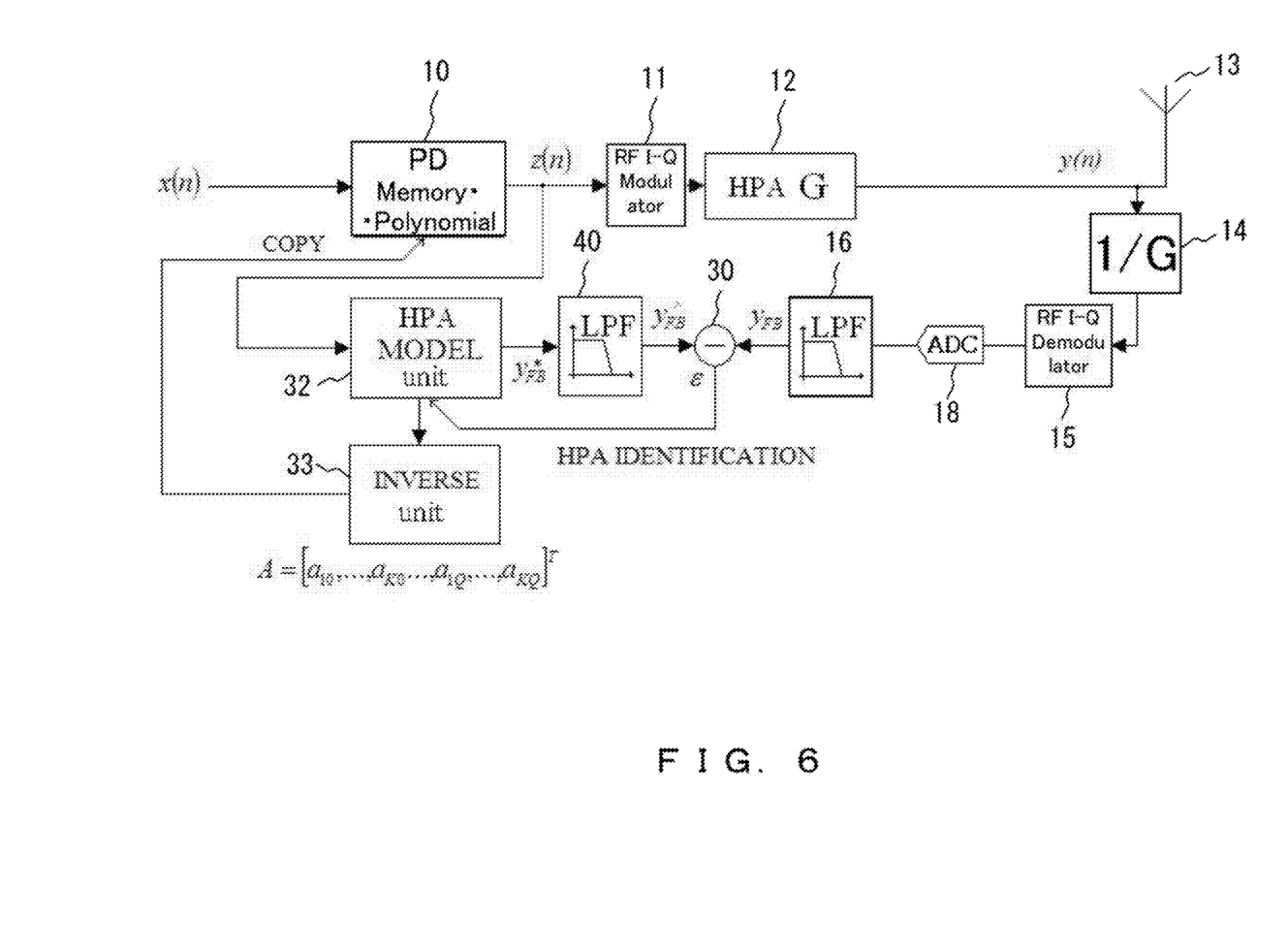
FIG. 6 illustrates an example of the configuration of the transmitter according to the embodiment.

FIG. 6 illustrates an example of the configuration of the transmitter according to the embodiment.

In FIG. 6, like components with those of FIGS. 1 and 5 are denoted with like numerals and their explanations are omitted.

This LPF 40 introduces the ISI term $\hat{\delta}(n)$ (similar to the ISI term $\delta(n)$) that compensates the ISI term $\delta(n)$ from LPF 16 placed in the feedback path (see equations (10)-(14) for the detailed explanation).

Another possible alternative for replica ISI $\hat{\delta}(n)$ generation is a use of the equalizer. Usually, the equalizer operates similarly to the LPF. For an exemplar configuration of the equalizer, please refer to U.S. Pat. No. 5,175,747.

The linearization process is separated into two main steps:

step 1 During the first step, the HPA identification (between HPA 12 and the model of HPA MODEL unit 32) through the narrowband feedback path is performed and the HPA model parameters are obtained; an HPA Model can be identified with direct learning [non-patent documents 1, 4]. In this case the HPA model polynomial coefficients $p_k$ are updated according to expressions (9) and (10):

$$p_k(n) = p_k(n-1) + \mu \cdot z(n) \cdot \epsilon(n) \quad (9)$$

$$\epsilon(n) = \hat{y}_{FB}(n) - y_{FB}(n) \quad (10)$$

The HPA Model identification algorithm forced the error signal $\epsilon(n)$ in expression (10) to be equal to zero. The adaptive least mean square algorithm [non-patent documents 1, 3] can be used for this purpose.

Thus, according to FIG. 6, the error signal is a difference between the reference signal $\hat{y}_{FB}$ and the feedback signal $y_{FB}$:

$$\hat{y}FB(n) = LPF\{y^*_{FB}(n)\} + \hat{\delta}(n) \quad (11)$$

$$y_{FB}(n) = LPF\{y(n)\} + \delta(n) \quad (12)$$

In expressions (11) and (12), LPF{●} denotes the operation of the filtration by LPFs. A least mean square algorithm calculated in HPA MODEL unit 32 forces the error signal $\epsilon(n)$ to be equal to zero.

Thus, after convergence $$\epsilon(n) = \hat{y}FB(n) - y_{FB}(n) \approx 0, \text{ therefore } \hat{y}FB(n) \approx y_{FB}(n) \text{ and } \hat{\delta}(n) \approx \delta(n) \quad (13)$$

where $Y^*_{FB}{}^H$ denotes the complex conjugate transpose.

By substituting expressions (11) and (12) into expression (10), $$\epsilon(n) = \hat{y}_{FB}(n) - y_{FB}(n) = LPF\{y^*_{FB}(n)\} - LPF\{y(n)\} + \{\hat{\delta}(n) - \delta(n)\} \quad (14)$$

is obtained.

Because during convergence $\hat{\delta}(n) \approx \delta(n)$ in expression (13), the difference term $\{\hat{\delta}(n) - \delta(n)\} \approx 0$ in expression (14) is achieved.

Therefore there are no ISI terms (in the case of the perfect matching between LPF 16 and LPF 40) in the error signal $\epsilon(n)$ despite the narrowband feedback LPFs implementation. In other words, the ISI terms $\hat{\delta}(n)$ and $\delta(n)$ are compensated by each other during the error signal $\epsilon(n)$ calculations with expression (10).

When HPA Model parameters have been identified, the first step is completed.

step 2 During the second step, the inverse function (i.e. inverse memory polynomial) coefficients $A = [a_{10}, \ldots, a_{K0}, \ldots, a_{1Q}, \ldots, a_{KQ}]^T$) for an HPA model are obtained and the obtained results are copied into the transmission path predisorter 10. Expression (7) can be used for an inverse memory polynomial coefficient calculation during indirect learning [non-patent documents 3, 4].

The block-diagram of FIG. 6 with the narrowband feedback includes block INVERSE unit 33 that calculates the inverse function of the HPA model that is obtained in step 1. The analytical closed-form expression for an inverse function can be obtained only for an HPA model modeled with the memoryless polynomials in which the order P of the polynomial is less than or equal to 5.

In the more general cases of the memoryless polynomial HPA models with orders greater than 5 or for memory polynomials, the numerical iterative approach is required. The indirect learning according to non-patent document 3 provides a good approximation for a memory polynomial inverse function.

Figure 7:
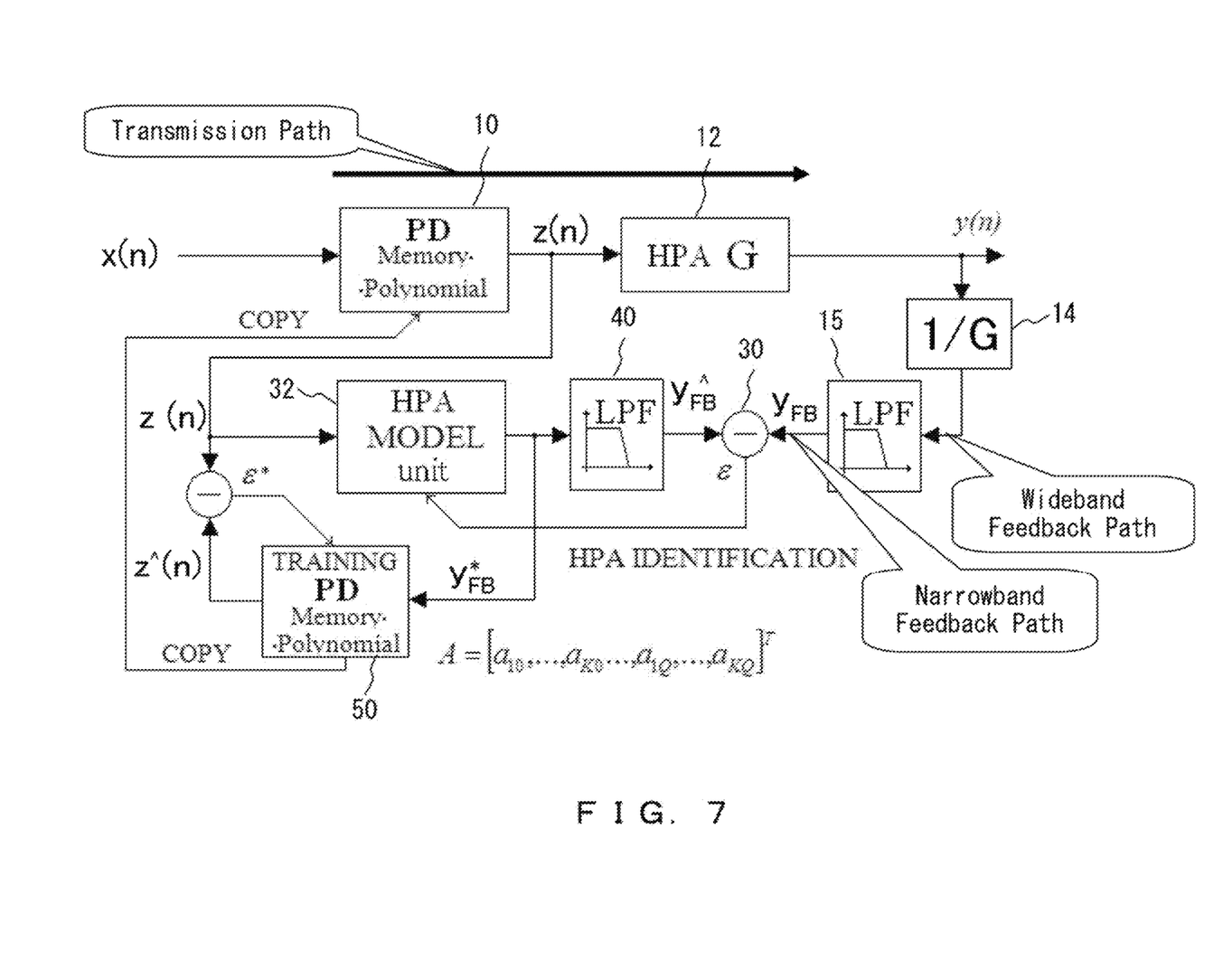
FIG. 7 illustrates one possible implementation of the two-step approach for the general HPA memory polynomial model with indirect learning.

FIG. 7 illustrates one possible implementation of the two-step approach for the general HPA memory polynomial model with indirect learning.

In FIG. 7, like components to those of FIG. 6 are denoted with like numerals and their explanations are omitted.

In FIG. 7, ADC, RF I-Q modulator and RF I-Q demodulator are omitted for brevity of explanation.

During the second step, the inverse function for the HPA Model is calculated in the Training PD 50. This operation is the same as that described in [non-patent document 3] (FIG. 1).

The training algorithm adjusts the Training PD parameters $A=[a_{10}, \ldots, a_{K0}, \ldots, a_{1Q}, \ldots, a_{KQ}]^T$ in such a way that the error signal $$\epsilon^*(n) = \hat{z}(n) - z(n)$$

is equal to zero or is in the matrix form $$Z = Y^*_{FB} \cdot A;$$

According to the least mean square solution, the PD parameters A are defined by [non-patent document 3]:

$$A = (Y^{*H}_{FB} \cdot Y^*_{FB}) \cdot Y^{*H}_{FB} \cdot Z \quad (15)$$

Finally, the coefficients $A=[a_{10}, \ldots, a_{K0}, \ldots, a_{1Q}, \ldots, a_{KQ}]^T$ obtained in expression (15) are copied into the actual PD 10 placed in the transmission path (FIG. 7). Thus, during the proposed two-step linearization algorithm, the negative influence of the interference term δ(n) to the DPD linearization performances have been eliminated.

Note that the output signal $y^*_{FB}$ of the HPA MODEL unit 32 for the training PD 50 is sent to the training PD 50 without filtering in the LPF 40. Therefore this feedback signal for the training PD 50 does not include the interference term $\hat{\delta}(n)$. Thus, during the training, training PD 50 calculates the inverse transfer function of the model modeled by HPA MODEL unit 32, undistorted by the interference term.

Figure 8:
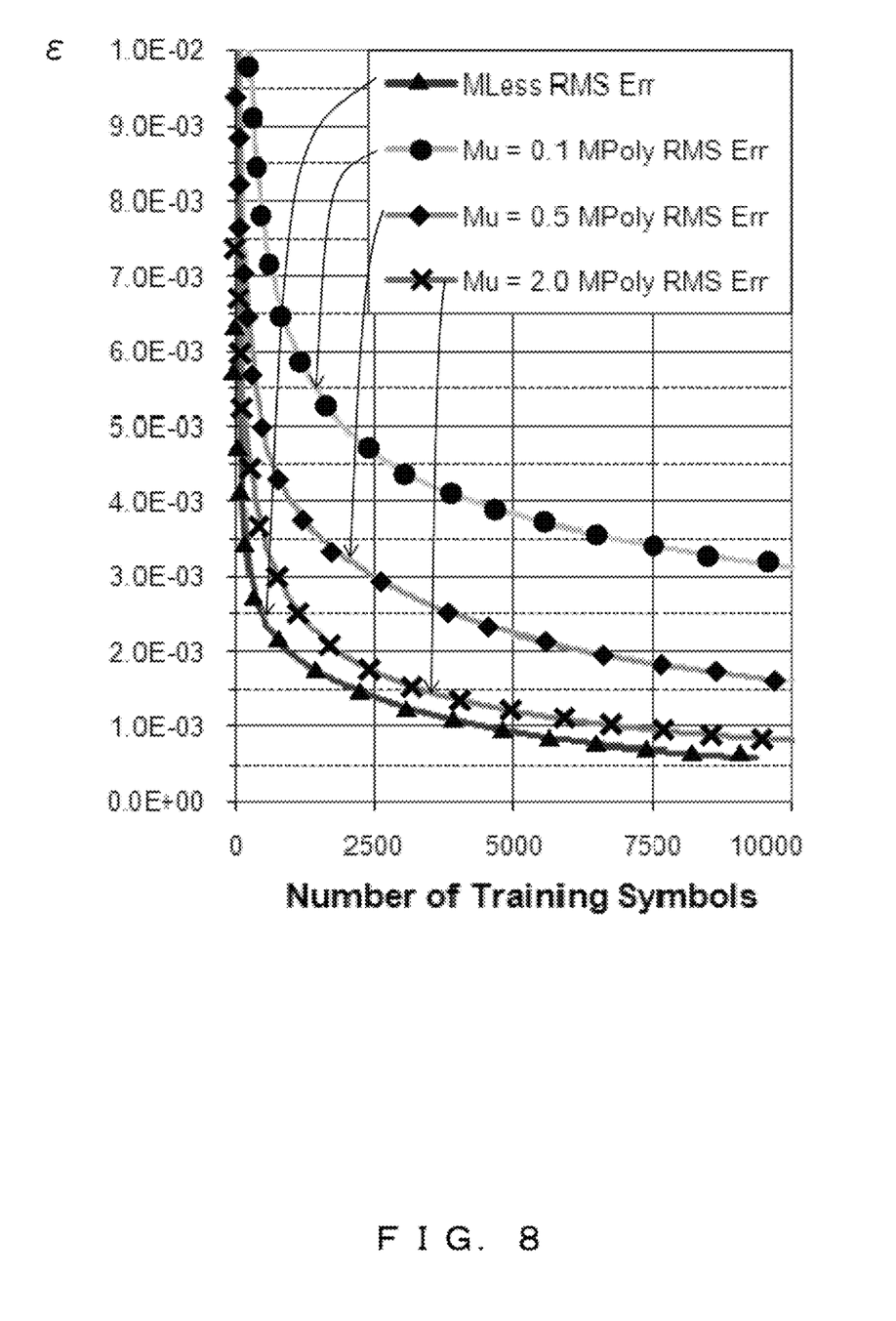
FIG. 8 illustrates the residual RMS memory polynomial HPA (P=5, memory depth Q=2) identification error $\epsilon$ as a function with the number of the training OFDM symbols for different step-size parameters $\mu$
Figure 9:
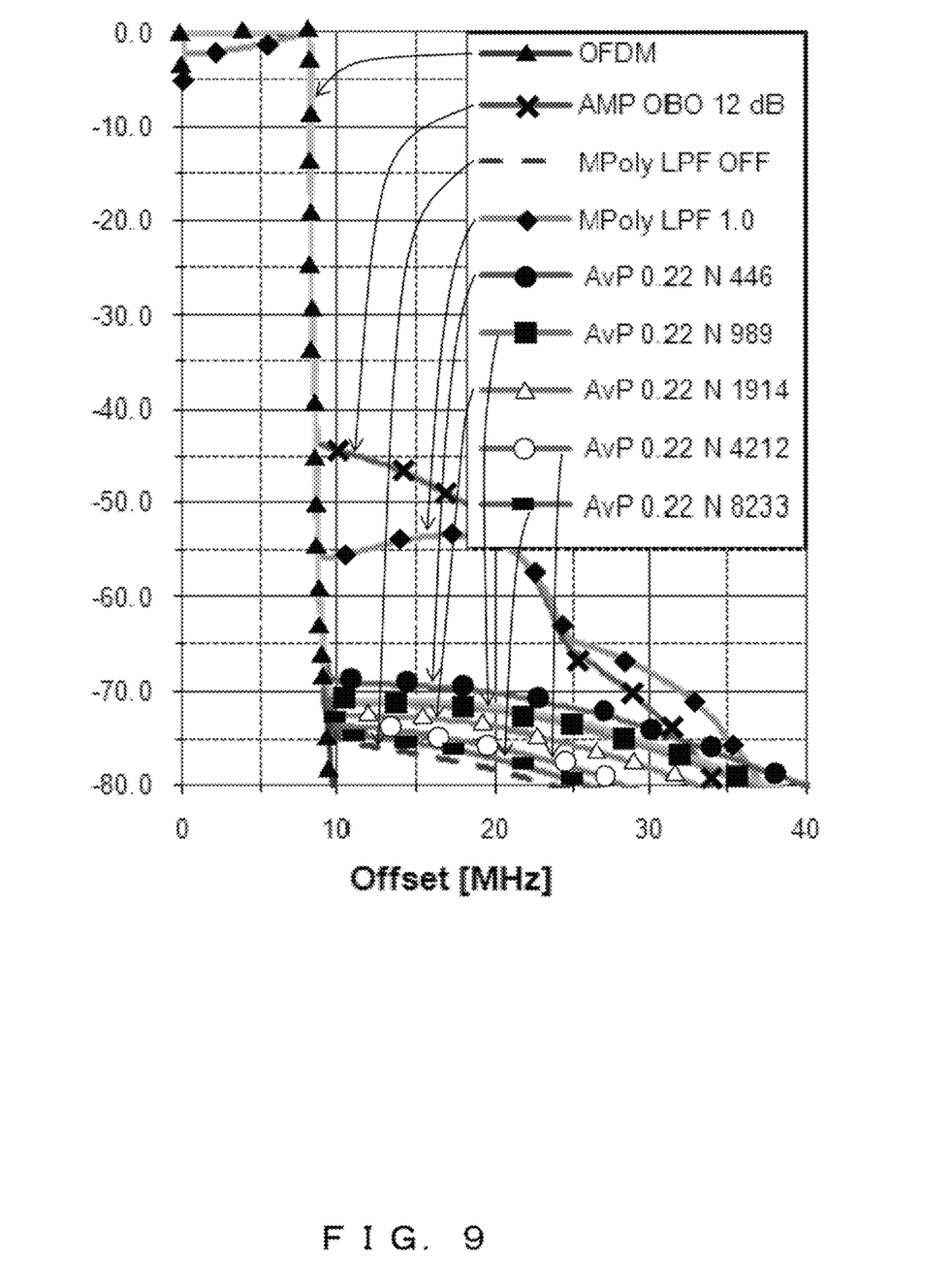
FIG. 9 illustrates the memory polynomial HPA output signal after linearization with indirect learning architecture with the number of the training OFDM symbols as a parameter for step-size constant $\mu$ being 2.0.

FIG. 8 illustrates the residual RMS memory polynomial HPA (P=5, memory depth Q=2) identification error ϵ as a function with the number of the training OFDM symbols for different step-size parameters μ in expression (9). FIG. 9 illustrates the memory polynomial HPA output signal after linearization with indirect learning architecture with the number of the training OFDM symbols as a parameter for step-size constant μ being 2.0.

In FIG. 8, in all cases, as the number of training symbols increases, error ϵ approaches zero. The memoryless case is the fastest for the error ϵ to approach zero. In other cases, as the step-size parameter μ increases, the error ϵ approaches zero more rapidly.

In FIG. 9, the target signal is indicated by a dotted line. "AvP" indicates an average power of the signals, which is the same for all cases. "N" indicates the number of the training symbols. As the number of the training symbols increases, out-of-band components of the signal go down, approaching the target signal. This means that as the number of the training symbols increases, training advances lead to a correct answer.

In the above embodiment, only LPF is illustrated in the feedback path for anti-aliasing. However, a band pass filter or a high pass filter may be used on behalf of the LPF according to various applications. In this case, an ISI Replica unit may be a band pass filter, a high pass filter, or an equalizer having a corresponding frequency characteristic. An ISI Replica unit is not limited to a low-pass filter, a high-pass filter, a band-pass filter, or an equalizer if an ISI Replica unit has a similar frequency characteristic to a filter introduced in the feedback path for anti-aliasing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:

1. An adaptive linearizer, comprising:
    a feedback path, a pass bandwidth of which is limited compared to an output signal bandwidth of an amplifier;
    an analog-to-digital converter that is placed in the feedback path and digitizes an output signal of the amplifier which is fed back by the feedback path;
    a filter that is placed in the feedback path after the analog-to-digital converter and limits a bandwidth of an output signal of the analog-to-digital converter;
    a replica unit that introduces interference components into an output signal modeling the characteristic of the amplifier, which have a similar characteristic of interference components induced by a limited pass bandwidth of the feedback path, by introducing interference components similar to those of the filter;
    a training unit that calculates an inverse characteristic of a characteristic of the amplifier using an error signal between an output signal of the replica unit and the output signal of the amplifier; and
    a predistorter that distorts a signal to be input to the amplifier according to the inverse characteristic calculated by the training unit.

2. The adaptive linearizer according to claim 1, wherein
    the filter is a first low-pass filter, and
    the replica unit is a second low-pass filter which has a similar characteristic to the first low-pass filter.

3. The adaptive linearizer according to claim 1, wherein
    the training unit comprises:
    an amplifier model unit that models a characteristic of the amplifier, and
    an inverse unit that calculates an inverse characteristic of the characteristic of the amplifier and inputs the inverse characteristic into the predistorter.

4. The adaptive linearizer according to claim 1, wherein
    the characteristic of the amplifier is represented by a memory polynomial, and
    the training unit models the characteristic of the amplifier by adjusting coefficients of the memory polynomial.

5. The adaptive linearizer according to claim 1, wherein
    the amplifier operates in an operation range extending to a non-linear region.

6. A transmitter, comprising:
    an adaptive linearizer, including:
    a feedback path, a pass bandwidth of which is limited compared to an output signal bandwidth of an amplifier;
    an analog-to-digital converter that is placed in the feedback path and digitizes an output signal of the amplifier which is fed back by the feedback path;
    a filter that is placed in the feedback path after the analog-to-digital converter and limits a bandwidth of an output signal of the analog-to-digital converter;
    a replica unit that introduces interference components into an output signal modeling the characteristic of the amplifier, which have a similar characteristic of interference components induced by a limited pass bandwidth of the feedback path, by introducing interference components similar to those of the filter;

a training unit that calculates an inverse characteristic of a characteristic of the amplifier using an error signal between an output signal of the replica unit and the output signal of the amplifier; and a predistorter that distorts a signal to be input to the amplifier according to the inverse characteristic calculated by the training unit.

7. An adaptive linearizing method for an adaptive linearizer provided with an amplifier and a feedback path, a pass bandwidth of which is limited compared to an output signal bandwidth of the amplifier, comprising:

introducing interference components into an output signal modeling the characteristic of the amplifier, which have a similar characteristic of interference components induced by a limited pass bandwidth of the feedback path, by introducing interference components similar to those of a filter that is placed in the feedback path after an analog-to-digital converter and limits a bandwidth of an output signal of the analog-to-digital converter, the analog-to-digital converter being placed in the feedback path and digitizing an output signal of the amplifier which is fed back by the feedback path;

calculating an inverse characteristic of a characteristic of the amplifier using an error signal between an output signal modeling the characteristic of the amplifier to which the interference components are introduced and the output signal of the amplifier; and distorting a signal to be input to the amplifier according to the inverse characteristic of the characteristic of the amplifier.

* * * * *